United States Patent
Bonache Martínez et al.

(10) Patent No.: US 11,658,655 B2
(45) Date of Patent: May 23, 2023

(54) PRECHARGE BUFFER STAGE CIRCUIT AND METHOD

(71) Applicant: Analog Devices International Unlimited Company, Limerick (IE)

(72) Inventors: Jesús Bonache Martínez, Valencia (ES); Italo Carlos Medina Sánchez Castro, Valencia (ES)

(73) Assignee: Analog Devices International Unlimited Company, Limerick (IE)

(*) Notice: Subject to any disclaimer, the term of this patent is extended or adjusted under 35 U.S.C. 154(b) by 0 days.

(21) Appl. No.: 17/721,590

(22) Filed: Apr. 15, 2022

(65) Prior Publication Data

US 2022/0416781 A1    Dec. 29, 2022
US 2022/0416781 A1    Dec. 29, 2022

Related U.S. Application Data

(60) Provisional application No. 63/216,367, filed on Jun. 29, 2021.

(51) Int. Cl.
*H03K 17/687*    (2006.01)
*H03F 3/45*    (2006.01)

(52) U.S. Cl.
CPC ....... *H03K 17/687* (2013.01); *H03F 3/45475* (2013.01)

(58) Field of Classification Search
None
See application file for complete search history.

(56) References Cited

U.S. PATENT DOCUMENTS

| | | | |
|---|---|---|---|
| 7,079,127 B2 * | 7/2006 | Morita | G09G 3/3291 345/212 |
| 7,619,552 B1 | 11/2009 | Schofield | |
| 7,663,424 B2 | 2/2010 | Stulik | |
| 7,746,253 B2 * | 6/2010 | Kitagawa | H03F 3/45977 341/122 |
| 7,787,321 B2 | 8/2010 | Luo et al. | |
| 8,850,887 B2 * | 10/2014 | Yanagisawa | G01C 19/56 73/504.12 |
| 8,994,564 B2 | 3/2015 | Hurrell et al. | |

(Continued)

FOREIGN PATENT DOCUMENTS

| | | |
|---|---|---|
| CN | 112614533 B | 11/2021 |
| DE | 102019215439 A1 | 4/2021 |
| EP | 1671303 B1 | 8/2014 |

OTHER PUBLICATIONS

Nicholas, Keith, "Understanding the benefits of pre-charge buffers in ADCs", Planet Analog, [Online] Retrieved from the Internet: <URL: https://www.planetanalog.com/understanding-the-benefits-of-pre-charge-buffers-in-adcs/>, (Oct. 25, 2021), 10 pgs.

(Continued)

*Primary Examiner* — Kenneth B Wells
(74) *Attorney, Agent, or Firm* — Schwegman Lundberg & Woessner, P.A (57) ABSTRACT

A circuit may include or may be coupled to a precharge structure to reduce or minimize a net perturbation, caused by switching, in the input source. Apparatus and techniques shown herein may enable low input current operation in a signal chain of an analog circuit by such reduction or minimization of such perturbation.

20 Claims, 5 Drawing Sheets

(56) References Cited

U.S. PATENT DOCUMENTS

| | | |
|---|---|---|
| 10,044,327 B2 * | 8/2018 | Wang .................. H03F 3/45475 |
| 10,114,114 B2 | 10/2018 | Leone et al. |
| 10,187,077 B2 | 1/2019 | Stulik |
| 10,733,391 B1 | 8/2020 | Medina Sánchez Castro, et al. |
| 10,931,122 B2 | 2/2021 | Hurrell et al. |
| 2014/0079079 A1 | 3/2014 | Mora Puchalt et al. |

OTHER PUBLICATIONS

Willis, David J, et al., "Zero CVF Input Current Switched-Capacitor Instrumentation Amplifier", IEEE 48th Midwest Symposium on Circuits and Systems, Covington, KY, USA, (Aug. 2005), 1255-1258.

* cited by examiner

PRECHARGE BUFFER STAGE CIRCUIT AND METHOD

CLAIM OF PRIORITY

This application claims the benefit of priority of U.S. Provisional Patent Application Ser. No. 63/216,367, titled "PRECHARGE SCHEME" to Jesús Bonache Martinez et al., filed on Jun. 29, 2021, the entire contents of which being incorporated herein by reference.

FIELD OF THE DISCLOSURE

This document pertains generally, but not by way of limitation, to electronic circuit input signal chain precharge management, and more specifically, to control of perturbation of an input signal associated with switching.

SUMMARY OF THE DISCLOSURE

A precharge buffer stage may be included as part of a signal chain to limit the possible perturbation of the input signal source caused by the signal acquisition operation, particularly for multiplexed and/or discrete time embodiments. In general, such precharge buffer stages exhibit a residual input current component, often dominated by its switching operation, which may be excessive for high-performance applications. This disclosure describes various techniques that effectively reduce or minimize the input current to a degree compatible with demanding applications.

In some aspects, this disclosure is directed to a precharge buffer stage circuit comprising: an amplifier circuit to precharge a signal chain input capacitance, wherein the amplifier circuit is configured to receive an input voltage; a precharge switch configured to couple an output node of the amplifier circuit to the signal chain input capacitance; a bypass switch configured to be coupled between the input voltage and the signal chain input capacitance, wherein the precharge and bypass switches are operated by complementary control signals; a first resistor-capacitor (RC) network electrically connected between the bypass switch and the input voltage to balance an impedance seen by the bypass switch; and a perturbation limiter circuit coupled to the output node of the amplifier circuit, wherein the perturbation limiter circuit is configured to stabilize a voltage at the output node of the amplifier circuit such that a charge injection of the precharge switch compensates for a charge injection of the bypass switch.

In some aspects, this disclosure is directed to a method of operating a precharge buffer stage circuit, the method comprising: precharging a signal chain input capacitance; coupling, using a precharge switch, an output node of an amplifier circuit to the signal chain input capacitance, wherein the amplifier circuit is configured to receive an input voltage; coupling a bypass switch between the input voltage and the signal chain input capacitance, wherein the precharge and bypass switches are operated by complementary control signals; coupling a first resistor-capacitor (RC) network between the bypass switch and the input voltage to balance an impedance seen by the bypass switch; and coupling a perturbation limiter circuit to the output node of the amplifier circuit, wherein the perturbation limiter circuit is configured to stabilize a voltage at the output node of the amplifier circuit such that a charge injection of the precharge switch compensates for a charge injection of the bypass switch.

In some aspects, this disclosure is directed to a precharge buffer stage circuit comprising: a first amplifier circuit to precharge a signal chain input capacitance, wherein the first amplifier circuit is configured to receive an input voltage; a precharge switch configured to couple an output node of the amplifier circuit to the signal chain input capacitance; a bypass switch configured to be coupled between the input voltage and the signal chain input capacitance, wherein the precharge and bypass switches are operated by complementary control signals; a first resistor-capacitor (RC) network electrically connected between the bypass switch and the input voltage to balance an impedance seen by the bypass switch; and a perturbation limiter circuit coupled to the output node of the first amplifier circuit, wherein the perturbation limiter circuit includes a second amplifier circuit configured to receive the input voltage and generate a buffered input voltage, wherein corresponding control terminals of the precharge switch and the bypass switch are bootstrapped to the buffered input voltage generated by the second amplifier circuit; and wherein the perturbation limiter circuit is configured to stabilize a voltage at the output node of the first amplifier circuit such that a charge injection of the precharge switch compensates for a charge injection of the bypass switch.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various examples discussed in the present document.

DETAILED DESCRIPTION

A precharge buffer stage may be included as part of a signal chain to limit the possible perturbation of the input signal source caused by the signal acquisition operation, particularly for multiplexed and/or discrete time embodiments. In general, such precharge buffer stages exhibit a residual input current component, often dominated by its switching operation, which may be excessive for high-performance applications. The present inventors have recognized a need for a precharge scheme that effectively reduces or minimizes the input current to a degree compatible with demanding applications.

Generally, an analog signal chain accepts an analog input $V_i$ from a source to be processed. The input source circuitry may be sensitive to the loading caused by the front-end of the signal chain, and this may introduce a source of error, especially if the output impedance of the source and/or the frequency of operation are substantial. Such considerations are relevant if the input node of the signal chain has a capacitive nature, and the source is to charge said capacitance for significant voltage steps and/or at a fast rate. This tends to be the case for multiplexed channels, chopped signal chains and/or Switched-Capacitor (SC) front-end schemes.

A loading effect of the signal chain in the input source for such scenarios may be conceptualized by the average input current $I_i$ to be supplied by the source circuitry to charge the equivalent input capacitance $C_i$ of the signal chain. For an average voltage step $\Delta V_i$ and a frequency of operation f, the average input current may be expressed as:

$$I_i = C_i \cdot \Delta V_i \cdot f \propto \Delta V_i \qquad \text{(Eq. 1)}$$

This input current $I_i$ will flow through the output resistance of the input source producing an error if there is not enough time for the input voltage step $\Delta V_i$ to settle. This may impact the dynamic performance and/or accuracy of the signal chain or may impose limitations on the output resistance or the nature of the input source, both effects being undesirable. To mitigate such a situation, in one approach, a dedicated amplifier is used to precharge the signal chain input capacitance $C_i$ to the updated input $V_i$ and only reconnects the input source to the signal chain front-end once $C_i$ is charged close enough to the new value in order to present a smaller voltage step $\Delta V_i$ to be charged by the input source, proportionally reducing the resulting input current as implied by Eq. 1.

Figure 1:
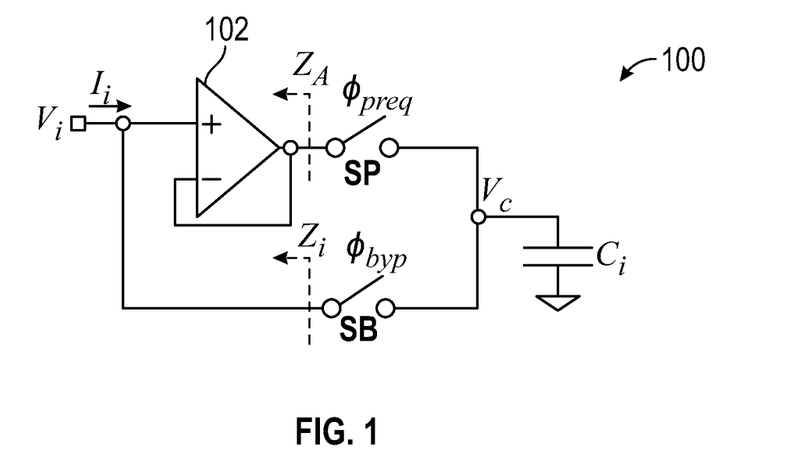
FIG. 1 is a schematic diagram of an example of a precharge buffer stage circuit.
Figures 2A, 2B, 2C, 2D:
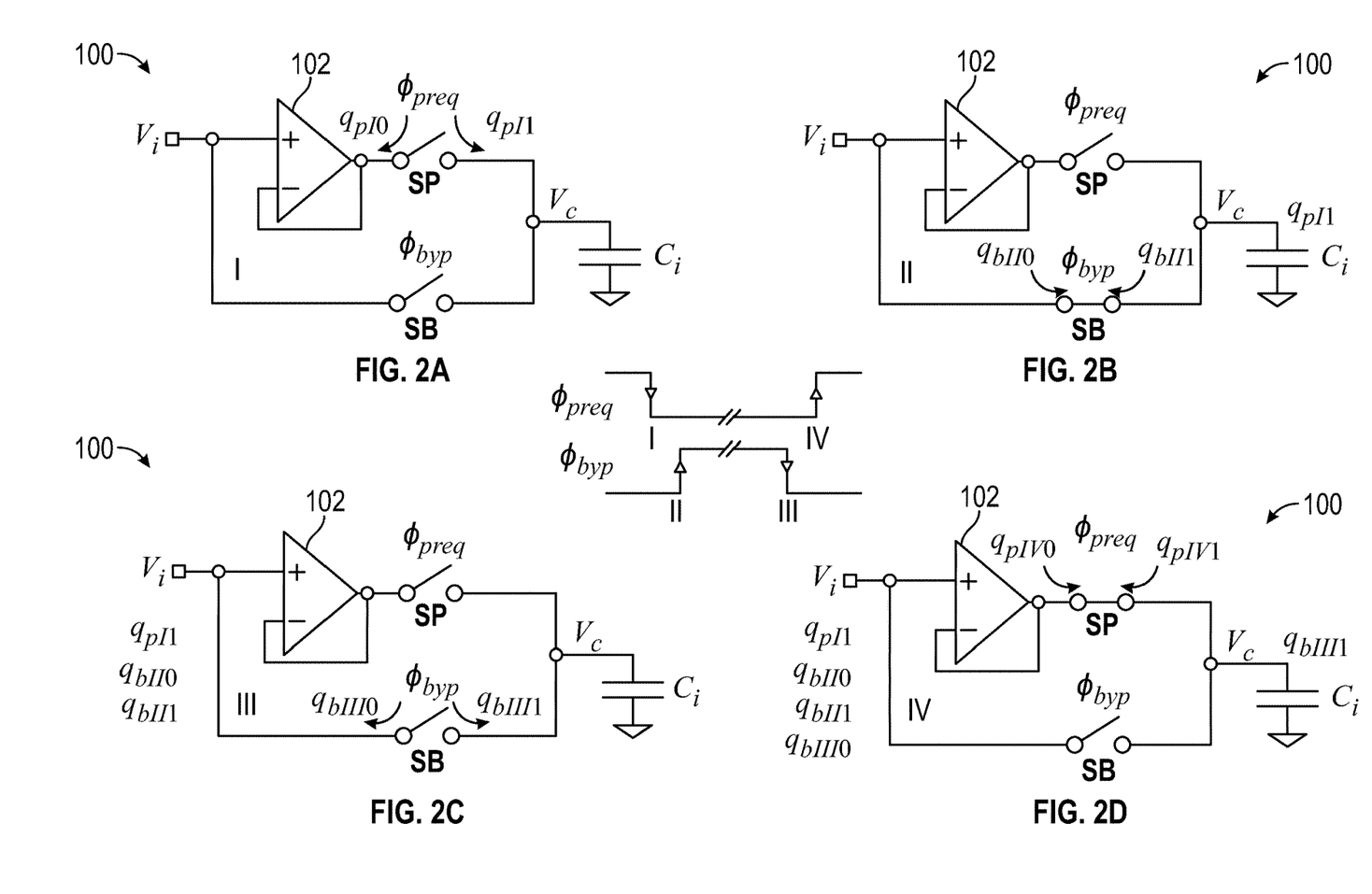
FIGS. 2A-2D depict the precharge buffer stage circuit 100 of FIG. 1 during a cycle of operation.

FIG. 1 is a schematic diagram of an example of a precharge buffer stage circuit 100. The precharge buffer stage circuit 100 may include a precharge amplifier circuit 102 that accepts an input voltage source $V_i$, a capacitance $C_i$ modelling the signal chain input impedance, a switch SP that connects the output of the precharge amplifier circuit 102 to the capacitance $C_i$ (controlled by the clock signal $\phi_{preq}$) and a switch SB that connects the input voltage source $V_i$ to the capacitance $C_i$ (controlled by the clock signal $\phi_{byp}$).

The operation of the precharge buffer stage of FIG. 1 may be defined by a couple of complementary and non-overlapping clock signals $\phi_{preq}$ and $\phi_{byp}$, which transition at the frequency of operation f that is assumed to be higher than the input $V_i$ frequency $f_i$ by enough margin for the precharge operation to be useful. In some examples, it may be desirable to implement the switches SP and SB in FIG. 1 as Field-Effect Transistors (FET) because this technology, in comparison to other, may enable the fabrication of switches with a superior performance and versatility.

When $\phi_{preq}$ is active, the switch SP is closed, the switch SB is opened, and the precharge amplifier circuit 102 drives the capacitance $C_i$, forcing the voltage $V_c$ at the terminal of the capacitance $C_i$ to the new input voltage $V_i$. During this precharge phase, the input current $I_i$ will be essentially zero because the input source only connects to the open switch SB and the input of precharge amplifier circuit 102, which is assumed to be high impedance. When $\phi_{byp}$ is active, the switch SP is opened and the switch SB is closed; therefore, the input voltage $V_i$ directly drives the capacitance $C_i$ for the fine settling of the voltage $V_c$ to the new voltage $V_i$.

During the bypass phase thus formed, the input current $I_i$ will be proportional to the difference between the precharged value K and the new $V_i$, a gap established, in a first approach, by the residual error of the precharge amplifier circuit 102. Generally, the precharge amplifier circuit 102 should operate robustly for the entire expectable range of $V_i$ (which may imply a rail-to-rail operation). The error of precharge amplifier circuit 102, however, is relevant in relation to the residual current $I_i$ caused by the difference between the precharged value $V_c$ and the actual input voltage $V_i$, because during phase $\phi_{byp}$ the input source is directly connected to the capacitance $C_i$.

A final error in the input signal conveyed to the capacitance $C_i$ would generally result from a potentially incomplete settling of the input voltage $V_i$ into the capacitance $C_i$ by the input source. Therefore, for simultaneous low current $I_i$ and low final voltage $V_i$ error, the output of precharge amplifier circuit 102 is to be settled as close as possible to the actual input and as fast as possible, because the more time available for the fine settling of the input source driving the capacitance $C_i$, the smaller the final error.

The considerations mentioned above may favor an asymmetrical sizing of the length of phases $\phi_{preq}$ and $(I)_{byp}$: $\phi_{preq}$ occupies a reduced portion of the total available duration while the rest is allocated to the fine settling that happens during phase $\phi_{byp}$. Hence, the precharge amplifier circuit 102 generally is to provide a high enough slew rate to bring $V_c$ close to $V_i$ as quickly as feasible. This, in turn, may include the use of power cycling the precharge amplifier circuit 102 in such a way that the precharge amplifier circuit 102 is unpowered when unused during phase $\phi_{byp}$ (possibly, keeping it just biased for a smoother transitions between phases) while as much power as needed for a competitive settling is delivered to the precharge amplifier circuit 102 during the relatively short phase $\phi_{preq}$, thus enabling some degree of power efficiency.

Accordingly, in a precharge buffer stage following the approach shown by FIG. 1, the input current $I_i$ is basically reduced to the one resulting during the bypass phase (e.g., when $\phi_{byp}$ is active) from the residual precharge error. If this source of input current $I_i$ is reduced by a configuration of the precharge amplifier circuit 102 to minimize its output error at the end the precharge phase (for example, applying autozeroing or chopping to the precharge amplifier 102), the resulting current $I_i$ may generally be dominated by other non-idealities; notably, by the charge injection of the switches SB and SP, when implemented as FET devices.

The charge Q injected into the terminals of a switch every time its state transitions is formed, mainly, by 2 components: the charge trapped in the channel $Q_{ch}$ and the clock-feedthrough charge $Q_{clk}$ due to gate-source coupling. Therefore, Q may be quantified as (where W is the width of the transistor, L is the effective length of the transistor, $C_{ox}$ is the gate-oxide capacitance per unit area, $C_{ov}$ is the gate-source overlapping capacitance per unit width, $V_{GS}$ is the gate-source voltage, $V_{TH}$ is the threshold voltage, $V_H$ is the clock high voltage level and $V_L$ is the clock low voltage level):

$$Q = Q_{ch} + Q_{clk} = W \cdot L \cdot C_{ox} \cdot (V_{GS} - V_{TH}) + W \cdot C_{ov} \cdot (V_H - V_L) \qquad \text{(Eq. 2)}$$

The input current $I_i$ achieved by a precharge buffer stage of the type shown in by FIG. 1 (or variations), possibly dominated by the charge injection of the relevant switches, may be acceptable for various applications. However, for high-accuracy applications that demand low distortion in the presence of input sources with high output resistance, this may not be sufficient. Accordingly, the present inventors have recognized, among other things, solutions as described herein to address a need for a precharge scheme that effectively reduces or minimizes an input current induced by the switching of the precharge buffer stage to support demanding applications.

Generally, the average input current $I_i$ caused by the charge injection of the switches SP and SB of FIG. 1 is established by the net charge injection $q_i$ of those elements into the input source. The charge injection of the switches is studied next in FIGS. 2A-2D for the relevant transitions of the non-overlapping clock signals $\phi_{preq}$, $\phi_{byp}$ during a cycle of operation.

FIGS. 2A-2D depict the precharge buffer stage circuit 100 of FIG. 1 during a cycle of operation. The precharge switch SP and the bypass switch SB are controlled by complementary and non-overlapping clock signals $\phi_{preq}$ and $\phi_{byp}$, respectively, as shown. The relevant events, in chronological order, are:

I. $\phi_{preq}$ goes inactive (precharge ends): the switch SP opens, injecting a charge $q_{pI0}$ that is absorbed by the precharge amplifier circuit 102 (and permanently lost) and a charge $q_{pI1}$ into the capacitance $C_i$, being stored.

II. $\phi_{byp}$ goes active (the input voltage $V_i$ starts driving the capacitance $C_i$): the switch SB closes, injecting a charge $q_{bII0}$ into the input voltage $V_i$ and a charge $q_{bII1}$ into the capacitance $C_i$, which recirculates, along with the previously stored charge $q_{pI1}$, to $V_i$ through the switch SB.

III. $\phi_{byp}$ goes inactive ($V_i$ stops driving the capacitance $C_i$): SB opens, injecting a charge $q_{bIII0}$ into $V_i$ and a charge $q_{bIII1}$ into the capacitance $C_i$, being stored.

IV. $\phi_{preq}$ goes active (precharge begins): the switch SP closes, injecting a charge $q_{pIV0}$ that is absorbed by precharge amplifier circuit 102 (and permanently lost) and a charge $q_{pIV1i}$ into the capacitance $C_i$, which recirculates, along with the previously stored charge $q_{bIII1}$, to precharge amplifier circuit 102 through the switch SP and they are permanently lost.

The net charge delivered by the input source $V_i$ per cycle is, from the preceding analysis:

$$q_i = q_{pI1} + q_{bII0} + q_{bII1} + q_{bIII0} \quad \text{(Eq. 3)}$$

The charge injection of a FET switch (given by Eq. 2) is divided, not necessarily in a symmetrical way, between its 2 terminals (arbitrarily designated as the drain and the source). Moreover, the total charge injection of a switch during a falling and a rising transition at its gate voltage has opposite polarity and it is the same in magnitude for some given terminal voltages. The total charge of the switch SB when it closes (instant II in FIG. 2) and when it opens (instant III in FIG. 2) is the same in magnitude and with opposite polarity. Therefore:

$$q_{bII0} + q_{bII1} = -(q_{bIII0} + q_{bIII1}) \rightarrow q_{bII1} = -q_{bIII0} - q_{bII1} - q_{bII0} \quad \text{(Eq. 4)}$$

Consequently, applying Eq. 4 into Eq. 3:

$$q_i = q_{pI1} - q_{bIII1} \quad \text{(Eq. 5)}$$

Eq. 5 indicates that $q_i = 0$ and, thus, no net average input current is induced by the switches of FIG. 1 (the target of this disclosure) if $|q_{pI1}| = |q_{bIII1}|$; since $q_{pI1}$ and $q_{bIII1}$ have the same polarity, such condition reduces to $q_{pI1} = q_{bIII1}$. In other words, if the charge $q_{pI1}$ injected by the precharge switch SP into $C_i$ when it opens matches the charge $q_{bIII1}$ injected by the bypass switch SB into $C_i$ when it opens, then there is no net charge injected into the input source by the switching of the precharge stage.

As a result, a technique that forces $q_{pI1} = q_{bIII1}$ would achieve or approach the goal $q_i = 0$. This may be accomplished if both the total charge injection and its split between the terminals of the switch SP and the switch SB is matched for the clock transitions marked as I and III in FIG. 2 (both clock transitions having the same polarity). Such matching criteria depend on equalizing several factors between the switch SP and the switch SB:

1. Switch typology.
2. Switch gate area.
3. Clock signal transition slope.
4. Voltages at switch terminals.
5. Impedance at switch terminals.

Factors 1 to 3 may be equalized by various techniques. Regarding the terminal voltages, all terminals of both switches at the relevant instants are nominally set to $V_i$ (as part of the precharge operation) and, thus, equal. Hence, the only remaining factor to match in order to achieve the desired charge injection cancellation is the impedance at the terminals of the corresponding switches.

Switches SP and SB, as shown by FIG. 1, have a common terminal $V_C$ and, thus, the impedance at that terminal (dominated by the capacitance $C_i$) is the same for both matched switches. The other terminal of SP is connected to the output of the precharge amplifier 102, having an impedance $Z_A$, and the other terminal of the switch SB connects to the input source directly, having an impedance $Z_A$. In general, $Z_A$ does not match $Z_A$. However, if $Z_i$ is stable and $Z_A \ll Z_i$, which may be achieved by a realization of precharge amplifier circuit 102, and given that $Z_A$ is generally a controllable parameter, an RC network may be added between the bypass switch SB and the input source to balance $Z_A$ with the equivalent input impedance $Z_{eq}$ thus obtained. In general, as part of the impedance balancing and, possibly, to linearize the equivalent output impedance $Z_{eqA}$ of the precharge amplifier 102, a RC network may also be added between the precharge switch SP and the output of the precharge amplifier 102.

Figure 3:
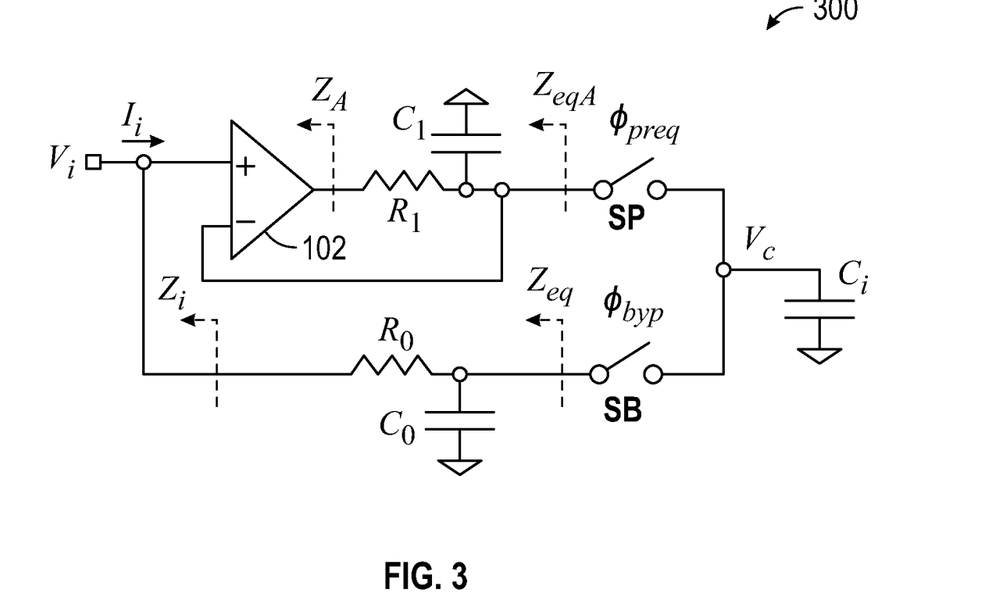
FIG. 3 is a schematic diagram of another example of a precharge buffer stage circuit with a generic impedance balance.

FIG. 3 is a schematic diagram of another example of a precharge buffer stage circuit 300 with a generic impedance balance. The precharge buffer stage circuit 300 includes a resistor $R_0$ and a grounded capacitor $C_0$ in connection with a switch SB, and a resistor $R_1$ and a grounded capacitor $C_1$, in connection with a switch SP. Sizing $R_0$, $C_0$, $R_1$ and $C_1$ in such a way that, for the frequency range of interest, the impedances at the terminals of both switches SP and SB are balanced ($Z_{eqA} \approx Z_{eq}$) may equalize the charge injection split of their matched total charge injection. Therefore, the required relation a $q_{pI1} = q_{bIII1}$ is obtained and, by Eq. 5, $q_i = 0$; thus, the average input current $I_i$ induced by the charge injection of the precharge buffer stage switches (which is proportional to $q_i$) is nominally cancelled as targeted.

The presented charge injection cancellation relies, at least in part, on the fact that the voltage at the terminals of the relevant switches during the corresponding transitions are similar (and ideally the same). In practice, the output voltage of the precharge amplifier circuit 102 during the switching events may exhibit transient perturbations that cause the effective voltage at the corresponding terminal of switch SP to depart, due to the finite bandwidth of the precharge amplifier circuit 102, from the expectable value $V_i$ at the relevant clock transition. In turn, this may induce a residual error in the described charge injection cancellation and, thus, a corresponding input current $I_i$ increase. The switching perturbations may also imply, for the instant labelled as I in FIG. 2, that the precharge amplifier circuit 102 core is not settled (again, due its finite bandwidth) and, hence, the effective impedance exhibited by its output stage during the relevant transition would differ from its settled value assumed to establish the balancing RC networks formed by $R_0$, $C_0$, $R_1$ and $C_1$. As a result, the charge injection split of switches SP and SB may fail to be matched and, thus, a residual input current $I_i$ induced.

Therefore, in practice, to further reduce the input current $I_i$ induced by the charge injection of the relevant switches, some related techniques may be introduced to the precharge scheme described by FIG. 3 to further reduce or minimize the switching perturbations that could jeopardize the intended charge injection cancellation by the effects previously discussed. These considerations lead, as conceptually illustrated by the precharge buffer stage circuit of FIG. 4.

Figure 4:
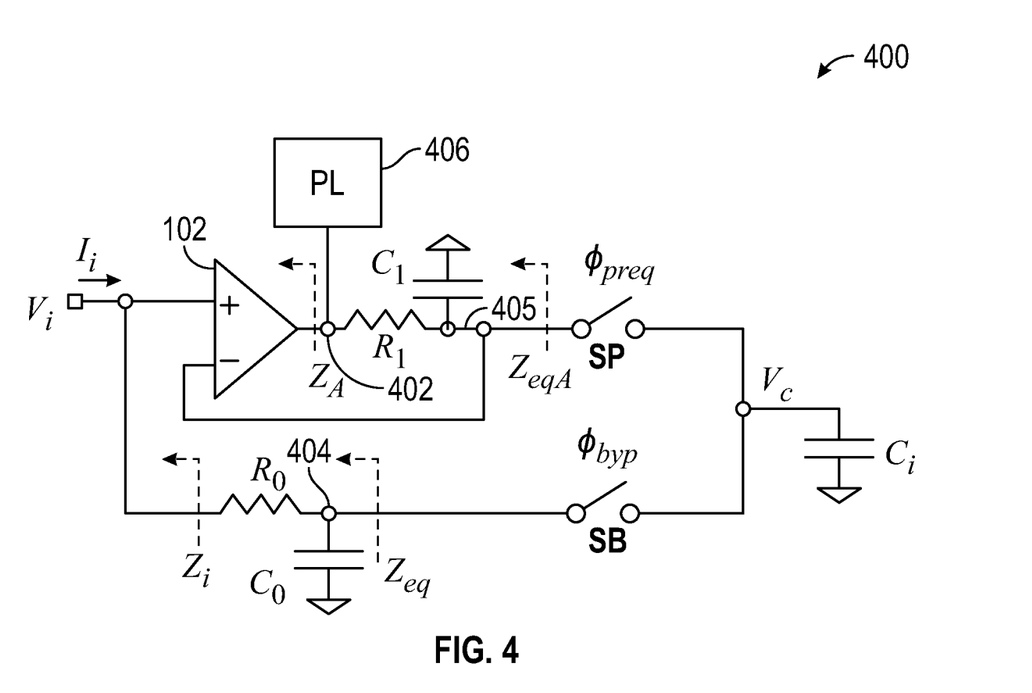
FIG. 4 is a schematic diagram of another example of a precharge buffer stage circuit that may implement various techniques of this disclosure.

FIG. 4 is a schematic diagram of another example of a precharge buffer stage circuit 400 that may implement various techniques of this disclosure. The precharge buffer stage circuit 400 may include a precharge amplifier circuit 102 to receive an input voltage $V_i$ and precharge a signal chain input capacitance $C_i$. The precharge buffer stage circuit 400 may include a precharge switch SP configured to be couple an output node 402 of the precharge amplifier circuit 102 to the signal chain input capacitance $C_i$. The precharge buffer stage circuit 400 may include a bypass switch SB configured to be coupled between the input voltage $V_i$ and the signal chain input capacitance $C_i$, where the precharge switch SP and the bypass switch SB are operated by complementary control signals. In some examples, the bypass switch SB is a replica of the precharge switch SP.

The precharge buffer stage circuit 400 may include a first resistor-capacitor (RC) network electrically connected between the bypass switch SB and the input voltage $V_i$ to balance an impedance seen by the bypass switch SB. For example, the first RC network may include a first resistive component $R_0$ coupled between the input voltage $V_i$ and the bypass switch SB and a first capacitive component $C_0$ coupled to a node 404 between the first resistive component $R_0$ and the bypass switch SB and to a static voltage. In some examples, either or both the first resistive component $R_0$ and first capacitive component $C_0$ may be adjustable, such as trimmable.

Optionally, in some examples, the precharge buffer stage circuit 400 may include a second RC network electrically connected between the precharge switch SP and the output node 402 of the precharge amplifier circuit 102 to balance an impedance seen by the precharge switch SP. For example, the second RC network may include a second resistive component $R_1$ coupled between the output node 402 of the precharge amplifier circuit 102 and the precharge switch SP and a second capacitive component $C_1$ coupled to a node 405 between the second resistive component $R_1$ and the precharge switch SP and to a static voltage. In some examples, either or both the second resistive component $R_1$ and first capacitive component $C_1$ may be adjustable, such as trimmable.

The precharge buffer stage circuit 400 may include a perturbation limiter circuit 406. The perturbation limiter circuit 406 may be coupled (either directly or indirectly) to the output node 402 of the amplifier circuit 102 and may limit the effects of the perturbations discussed above. The perturbation limiter circuit 406 may be configured to stabilize a voltage at the output node 402 of the amplifier circuit 102 such that a charge injection of the precharge switch SP matches a charge injection of the bypass switch SB.

In some examples, the precharge amplifier circuit 102 may be power cycled when the bypass switch SB is active.

In some examples, the precharge amplifier circuit 102 may be arranged in a unity-gain configuration, such as shown in FIG. 4.

As described in more detail below with respect to FIG. 5, the perturbation limiter circuit 406 may include some modifications of the precharge switch SP as part of the strategy to limit the effect of perturbations; by extension (to keep the matching), such modifications would also affect, totally or partially, the bypass switch SB.

Figure 5:
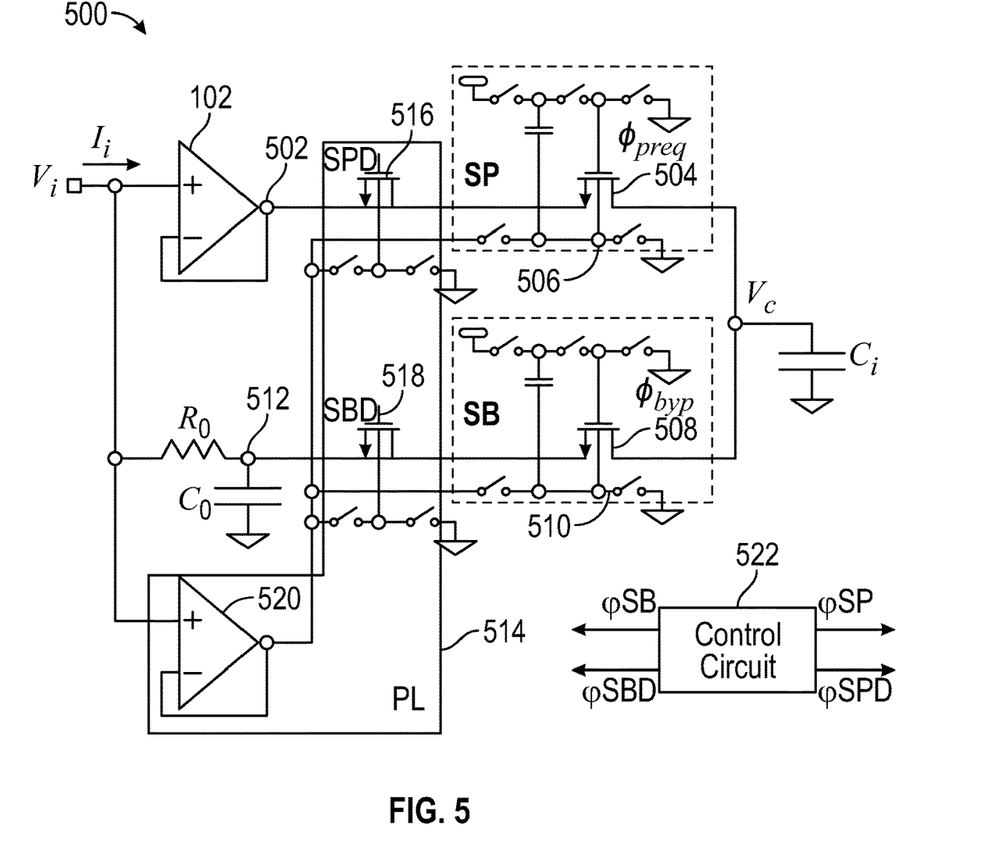
FIG. 5 is a schematic diagram of another example of a precharge buffer stage circuit that may implement various techniques of this disclosure.

FIG. 5 is a schematic diagram of another example of a precharge buffer stage circuit 500 that may implement various techniques of this disclosure. The precharge buffer stage circuit 500 may include a precharge amplifier circuit 102 to receive an input voltage $V_i$ and precharge a signal chain input capacitance $C_i$.

The precharge buffer stage circuit 500 may include a precharge switch SP configured to couple an output node 502 of the precharge amplifier circuit 102 to the signal chain input capacitance $C_i$. In some examples, the precharge switch SP may include a first field-effect transistor 504 having a first back-gate terminal 506.

The precharge buffer stage circuit 500 may include a bypass switch SB configured to be coupled between the input voltage and the signal chain input capacitance $C_i$, where the precharge switch SP and the bypass switch SB are operated by complementary control signals $\phi_{preq}$ and $\phi_{byp}$, respectively. In some examples, the bypass switch SB may include a second field-effect transistor 508 having a second back-gate terminal 510.

The precharge buffer stage circuit 500 may include a first resistor-capacitor (RC) network electrically connected between the bypass switch SB and the input voltage $V_i$ to balance an impedance seen by the bypass switch SB. For example, the first RC network may include a first resistive component $R_0$ coupled between the input voltage $V_i$ and the bypass switch SB and a first capacitive component $C_0$ coupled to a node 512 between the first resistive component $R_0$ and the bypass switch SB and to a static voltage. In some examples, either or both the first resistive component $R_0$ and first capacitive component $C_0$ may be adjustable, such as trimmable.

The precharge buffer stage circuit 500 may include a perturbation limiter circuit 514. The perturbation limiter circuit 514 may be coupled (either directly or indirectly) to the output node 502 of the amplifier circuit 102 and may limit the effects of the perturbations discussed above. The perturbation limiter circuit 514 may be configured to stabilize a voltage at the output node 502 of the amplifier circuit 102 such that a charge injection of the precharge switch SP compensates for, e.g., substantially matches, a charge injection of the bypass switch SB.

In some examples, the perturbation limiter circuit 514 may include a first dummy switch SPD coupled to the switch SP adjacent the output node 502 of the precharge amplifier circuit 102. The first dummy switch SPD may be properly sized and synchronized in relation to the active switch SP to stabilize the voltage level of precharge amplifier circuit 102 during the corresponding transition of the switch SP. For matching, a second dummy switch SBD may be coupled to the bypass switch SB adjacent the input voltage $V_i$, where the second dummy switch SBD may be properly sized and synchronized in relation to the active switch SB. It is worth noting that the function of these dummy switches would not necessarily be a reduction of the net charge injection from their corresponding active switch, but the mitigation of the transient perturbation caused by the active switch at the relevant node. In some examples, the first dummy switch SPD may include a field-effect transistor 516 and the second dummy switch SBD may include a field-effect transistor 518.

In some examples, the precharge buffer stage circuit 500 may include another dedicated buffer circuit 520 configured to receive the input voltage $V_i$ (preferably, exhibiting a high input impedance) and to generate a buffered version of the input voltage $V_i$. The buffer circuit 520 may be selectively coupleable to the first back-gate terminal 506 and the second back-gate terminal 510. For example, if the precharge switch SP (and, therefore, the bypass switch SB for matching) is back-gate driven to achieve a given settling/charge injection (or area) trade-off, a dedicated buffer circuit 520 may be used to charge the back-gate terminal 506 to a voltage corresponding to the signal conveyed by the switch (in this case, $V_i$) so that the precharge amplifier circuit 102 does not experience such loading and the corresponding perturbation at its output is basically spared. In such a case, such back-gate driving will be replicated (in antiphase) for the corresponding dummy switch to also minimize the possible transient perturbation associated to it.

If the precharge switch SP (and, therefore, bypass switch SB for matching) is implemented as a bootstrapped switch to achieve a given linearity/charge injection (or area) trade-off, the sensing of the signal level typically performed by the switched-capacitor (SC) network of the bootstrapped switch may be done from the voltage provided by the buffer circuit 520, e.g., a dedicated buffer driving the back-gate terminal, instead of by the precharge amplifier circuit 102 to prevent loading it and, thus, perturbing it.

In the non-limiting example shown in FIG. 5, the precharge switch SP and the bypass switch SB are implemented as bootstrapped back-gate driven n-type field-effect transistors. The corresponding control terminals, e.g., gate terminals, of the precharge switch SP and the bypass switch SB may be bootstrapped to the input voltage, such as to a buffered input voltage level generated by buffer circuit 520.

The corresponding dummy switches SPD and SBD may be as replicas of their corresponding active switches, with the same length, half the width, and driven by complementary clock signals.

The perturbation limiter circuit 514 may include the dummy switches SPD and SBD, and the buffer circuit 520 that drives the back-gate and the input sensing capacitor of the bootstrapped SC network in both the active and dummy switches.

In some examples, the precharge amplifier circuit 102 may be power cycled when the bypass switch SB is active.

In some examples, the precharge amplifier circuit 102 may be arranged in a unity-gain configuration, such as shown in FIG. 5.

A control circuit 522 may be configured to output various control signals, such as including clock signals, to control one or more of the various switches in FIG. 5. For example, the control circuit 522 may output control signals φSP, φSB, φSPD, and φSBD to control the precharge switch SP, bypass switch SB, first dummy switch SPB, and the second dummy switch SBD, as described below with respect to FIG. 6.

Figure 6:
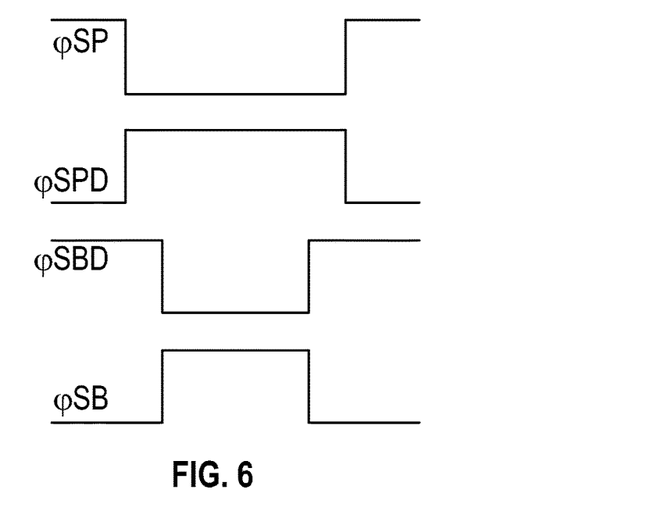
FIG. 6 is an example of a timing diagram of that may be used to control the precharge switch, the bypass switch, the first dummy switch, and the second dummy switch of FIG. 5.

FIG. 6 is an example of a timing diagram of that may be used to control the precharge switch, the bypass switch, the first dummy switch, and the second dummy switch of FIG. 5. The precharge switch SP of FIG. 5 may be configured to be controlled by a first control signal φSP and the bypass switch may be configured to be controlled by a second control signal φSB. In some examples, the control signals φSP and φSB of the precharge and bypass switches may be complementary and non-overlapping, as shown.

The first dummy switch SPD of FIG. 5 may be configured to be controlled by a third control signal φSPD that is opposite of the first control signal φSP. The second dummy switch SBD of FIG. 5 may be configured to be controlled by a fourth control signal φSBD that is opposite of the second control signal φSB. In some examples, the control signals φSPD and φSBD of the first and second dummy switches may be complementary and non-overlapping, as shown.

Figure 7:
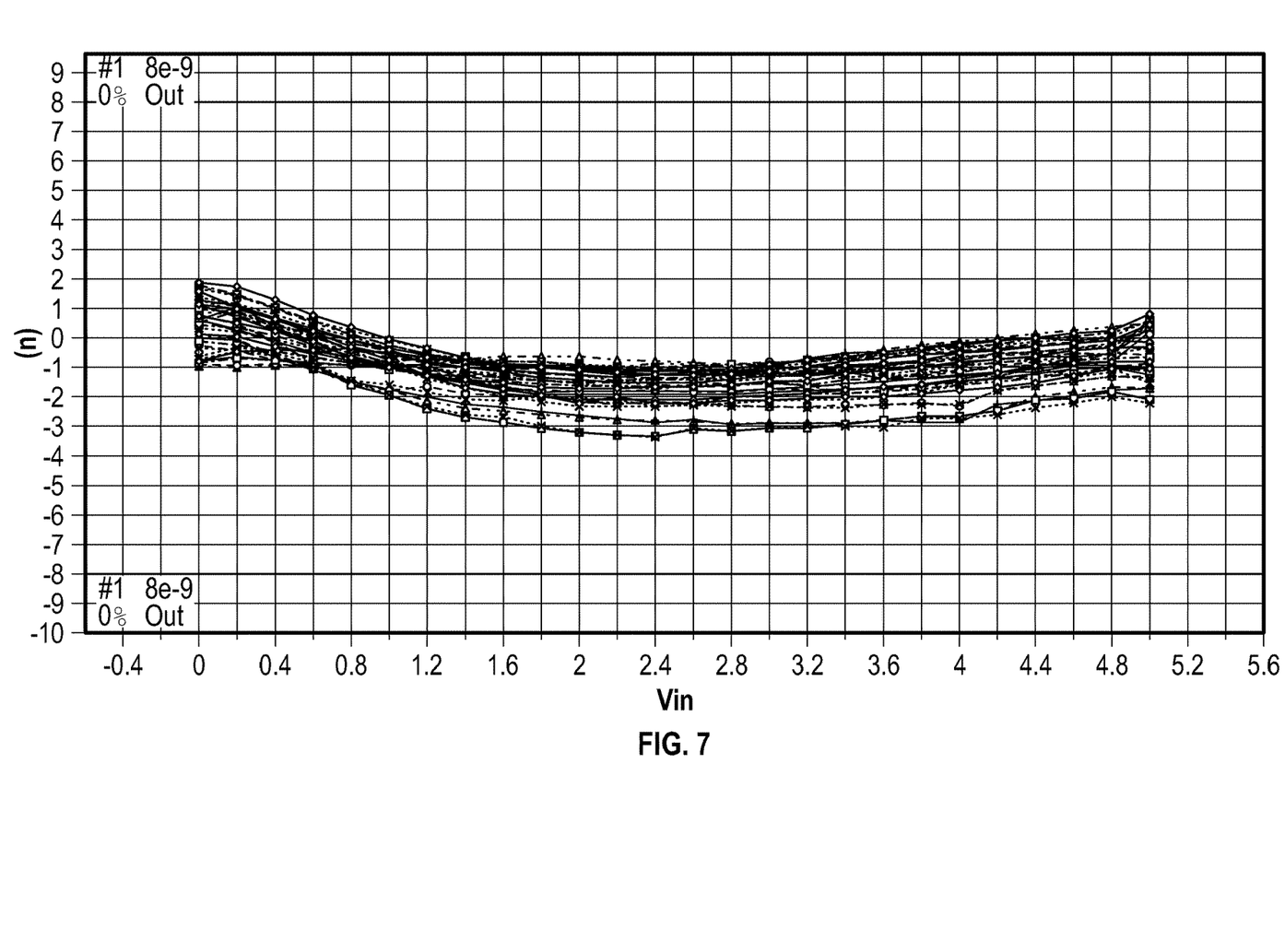
FIG. 7 is a graph depicting simulated average input current results, over process, temperature, supply, and input level variation, of a precharge scheme implemented according to the particular example of the approach shown in FIG. 5.

FIG. 7 is a graph depicting simulated average input current results, over process, temperature, supply, and input level variation, of a precharge scheme implemented according to the particular example of the approach shown in FIG. 5. In conclusion, the precharge scheme presented by FIG. 4 nominally cancels the net input current induced by its switching operation with a relatively low cost in terms of circuitry, offering a performance compatible with high accuracy applications and/or with the use of sensitive input sources. This is accomplished by a matching of the charge injection associated to the relevant switches, which entails the balance of the impedance at the terminals of said switches and the reduction or minimization of the transient perturbations that could affect such charge injection matching.

The proposed solution has been presented in the context of precharging single-ended signals; however, it is applicable to differential signals. For multiplexed signal chains, the precharge buffer stage can, in general, be merged with the multiplexer to offer both functionalities while reducing a count of switches in series and, thus, improving the dynamic behavior, layout area and/or leakage. The disclosed solution also accepts such modification. It was assumed that the presented precharge buffer stage interfaces to the input source. However, it could be equally applied to other sensitive nodes along the signal chain.

Generally, the presented solution is agnostic regarding the nature of the switches (labelled SP and SB in FIG. 4) and no particular implementation for the switches was assumed in the preceding description (other than for illustration purposes). The precharge scheme may accept any switch topology (such as a single transistor, a T-gate, and a bootstrapped switch) so long as they comply with the previously discussed matching considerations. As an example, FIG. 5 shows a possible implementation of the precharge buffer stage where the relevant switches are of the bootstrapped type. The previous discussion has generally assumed that the precharge amplifier circuit 102 and the buffer circuit 520 of FIG. 5 are implemented as operational amplifiers in unity gain negative feedback configuration. The disclosed technique would be equally applicable to other topologies. The techniques herein may be implemented monolithically, or in a discrete realization, or a combination of both. To further decrease the average input current $I_i$ drawn from an input source, a reduction of the equivalent input capacitance $C_i$ of the signal chain and/or the frequency of operation f may be considered, as indicated by Eq. 1. However, this approach will imply a tradeoff with other metrics, contrary to the disclosed solution that achieves a reduced input current by directly addressing the dominant source of residual $I_i$.

Other modifications or variations of the present subject matter are possible. For example, the RC network used to balance the impedances seen by the switches may be implemented in a number of ways (including the calibration of any of its components) while resulting equivalent to the disclosed concept. In particular, the impedance potentially added in series to the output of the precharge amplifier circuit 102 of FIG. 3 may be adapted to be included before or after the feedback sensing point of the precharge amplifier circuit 102.

Another modification may be merging the function of the precharge switch SP in FIG. 4 with the output stage of the precharge amplifier circuit 102. Various techniques (such as the use of dummy switches) may be applied to reduce the absolute net charge injection of individual switches in an attempt to further reduce or minimize the overall input current instead of strategically matching the charge injection of different switches to achieve a similar effect. This latter approach will be less competitive in terms of residual input current since the cancellation of the charge injection of individual switches may not be accurate in practice due to the poor control of the parameters involved and, it may invoke some form of tradeoff regarding the size of the relevant active switches and/or significant overhead for a comparable level of performance.

Various techniques aimed to reduce the magnitude of the charge injection of a switch could be incorporated as part of the disclosed precharge buffer stage without departing from the present subject matter. Regarding the circuits, techniques or technologies employed to reduce the perturbation at the output of the precharge amplifier circuit 102 (block PL in FIG. 4), there are multiple approaches possible depending, among other factors, on the nature of the precharge switch and the desired degree of residual input current reduction. Any of such possibilities is covered by the present technique, such as where the perturbation limiter circuit is operatively coupled, either directly or indirectly, to the output of the precharge amplifier 102.

Each of the non-limiting aspects above may stand on its own or may be combined in various permutations or combinations with one or more of the other aspects or other subject matter described in this document.

The above detailed description includes references to the accompanying drawings, which form a part of the detailed description. The drawings show, by way of illustration, specific embodiments in which the invention may be practiced. These embodiments are also referred to generally as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following aspects, the terms "including" and "comprising" are open-ended, that is, a system, device, article, composition, formulation, or process that includes elements in addition to those listed after such a term in a claim are still deemed to fall within the scope of that claim. Moreover, in the following aspects, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following aspects are hereby incorporated into the Detailed Description as examples or embodiments, with each aspect standing on its own as a separate embodiment, and it is contemplated that such embodiments may be combined with each other in various combinations or permutations.

The claimed invention is:

1. A precharge buffer stage circuit comprising:
   an amplifier circuit to precharge a signal chain input capacitance, wherein the amplifier circuit is configured to receive an input voltage;
   a precharge switch configured to couple an output node of the amplifier circuit to the signal chain input capacitance;
   a bypass switch configured to be coupled between the input voltage and the signal chain input capacitance, wherein the precharge and bypass switches are operated by complementary control signals;
   a first resistor-capacitor (RC) network electrically connected between the bypass switch and the input voltage to balance an impedance seen by the bypass switch; and
   a perturbation limiter circuit coupled to the output node of the amplifier circuit, wherein the perturbation limiter circuit is configured to stabilize a voltage at the output node of the amplifier circuit such that a charge injection of the precharge switch compensates for a charge injection of the bypass switch.

2. The precharge buffer stage circuit of claim 1, wherein the first RC network comprises:
   a first resistive component coupled between the input voltage and the bypass switch; and
   a first capacitive component coupled to a node between the first resistive component and the bypass switch and to a static voltage.

3. The precharge buffer stage circuit of claim 2, wherein at least one component of the first RC network is trimmable or otherwise adjustable.

4. The precharge buffer stage circuit of claim 1, comprising:
   a second resistor-capacitor (RC) network electrically connected between the precharge switch and the output node of the amplifier circuit to balance the impedance seen by the precharge switch.

5. The precharge buffer stage circuit of claim 4, wherein the second RC network comprises:
   a second resistive component coupled between the output node of the amplifier circuit and the precharge switch; and
   a second capacitive component coupled to a node between the second resistive component and the precharge switch and to a static voltage.

6. The precharge buffer stage circuit of claim 5, wherein at least one component of the second RC network is trimmable or otherwise adjustable.

7. The precharge buffer stage circuit of claim 1, wherein the amplifier circuit is a first amplifier circuit, and wherein the perturbation limiter circuit comprises:
a second amplifier circuit configured to receive the input voltage and generate a buffered input voltage.

8. The precharge buffer stage circuit of claim 7, wherein the precharge switch includes a first field-effect transistor having a first back-gate terminal, wherein the bypass switch includes a second field-effect transistor having a second back-gate terminal, and wherein the second amplifier circuit is selectively coupleable to the first back-gate terminal and the second back-gate terminal.

9. The precharge buffer stage circuit of claim 7, wherein corresponding control terminals of the precharge switch and the bypass switch are bootstrapped to the buffered input voltage generated by the second amplifier circuit.

10. The precharge buffer stage circuit of claim 1, wherein the perturbation limiter circuit comprises:
a first dummy switch coupled to the precharge switch adjacent the output node of the amplifier circuit; and
a second dummy switch coupled to the bypass switch adjacent the input voltage.

11. The precharge buffer stage circuit of claim 10, wherein the precharge switch is configured to be controlled by a first control signal, wherein the bypass switch is configured to be controlled by a second control signal, wherein the first dummy switch is configured to be controlled by a third control signal that is opposite of the first control signal, and wherein the second dummy switch is configured to be controlled by a fourth control signal that is opposite of the second control signal.

12. The precharge buffer stage circuit of claim 1, wherein corresponding control terminals of the precharge switch and the bypass switch are bootstrapped to the input voltage.

13. The precharge buffer stage circuit of claim 1, wherein the amplifier circuit is arranged in a unity-gain configuration.

14. The precharge buffer stage circuit of claim 1, wherein the bypass switch is a replica of the precharge switch.

15. The precharge buffer stage circuit of claim 1, wherein the complementary control signals of the precharge and bypass switches are non-overlapping.

16. A method of operating a precharge buffer stage circuit, the method comprising:
precharging a signal chain input capacitance;
coupling, using a precharge switch, an output node of an amplifier circuit to the signal chain input capacitance, wherein the amplifier circuit is configured to receive an input voltage;
coupling a bypass switch between the input voltage and the signal chain input capacitance, wherein the precharge and bypass switches are operated by complementary control signals;
coupling a first resistor-capacitor (RC) network between the bypass switch and the input voltage to balance an impedance seen by the bypass switch; and
coupling a perturbation limiter circuit to the output node of the amplifier circuit, wherein the perturbation limiter circuit is configured to stabilize a voltage at the output node of the amplifier circuit such that a charge injection of the precharge switch compensates for a charge injection of the bypass switch.

17. The method of claim 16, wherein the amplifier circuit is a first amplifier circuit, and wherein the perturbation limiter circuit comprises a second amplifier circuit configured to receive the input voltage and generate a buffered input voltage, the method comprising:
selectively coupling the second amplifier circuit to a first back-gate terminal of the precharge switch and to a second back-gate terminal of the bypass switch.

18. The method of claim 16, comprising:
power cycling the amplifier circuit when the bypass switch is active.

19. A precharge buffer stage circuit comprising:
a first amplifier circuit to precharge a signal chain input capacitance, wherein the first amplifier circuit is configured to receive an input voltage;
a precharge switch configured to couple an output node of the amplifier circuit to the signal chain input capacitance;
a bypass switch configured to be coupled between the input voltage and the signal chain input capacitance, wherein the precharge and bypass switches are operated by complementary control signals;
a first resistor-capacitor (RC) network electrically connected between the bypass switch and the input voltage to balance an impedance seen by the bypass switch; and
a perturbation limiter circuit coupled to the output node of the first amplifier circuit,
wherein the perturbation limiter circuit includes a second amplifier circuit configured to receive the input voltage and generate a buffered input voltage,
wherein corresponding control terminals of the precharge switch and the bypass switch are bootstrapped to the buffered input voltage generated by the second amplifier circuit; and
wherein the perturbation limiter circuit is configured to stabilize a voltage at the output node of the first amplifier circuit such that a charge injection of the precharge switch compensates for a charge injection of the bypass switch.

20. The precharge buffer stage circuit of claim 19, wherein the first RC network comprises:
a first resistive component coupled between the input voltage and the bypass switch; and
a first capacitive component coupled to a node between the first resistive component and the bypass switch and to a static voltage.

* * * * *